United States Patent
Kraxner et al.

(10) Patent No.: US 9,705,064 B2
(45) Date of Patent: Jul. 11, 2017

(54) CIRCUIT ASSEMBLY AND METHOD FOR CONTROLLING A PIEZOELECTRIC TRANSFORMER

(71) Applicant: EPCOS AG, Munich (DE)

(72) Inventors: Peter Kraxner, Fernitz (AT); Markus Puff, Graz (AT)

(73) Assignee: EPCOS AG, Munich (DE)

( * ) Notice: Subject to any disclaimer, the term of this patent is extended or adjusted under 35 U.S.C. 154(b) by 27 days.

(21) Appl. No.: 14/771,760

(22) PCT Filed: Mar. 19, 2014

(86) PCT No.: PCT/EP2014/055515
§ 371 (c)(1),
(2) Date: Aug. 31, 2015

(87) PCT Pub. No.: WO2014/154548
PCT Pub. Date: Oct. 2, 2014

(65) Prior Publication Data
US 2016/0027987 A1 Jan. 28, 2016

(30) Foreign Application Priority Data
Mar. 27, 2013 (DE) .................. 10 2013 103 159

(51) Int. Cl.
*H01L 41/04* (2006.01)
(52) U.S. Cl.
CPC .................. *H01L 41/044* (2013.01)
(58) Field of Classification Search
CPC .............. H01L 41/042; H01L 41/044
USPC ........................... 310/314, 317, 318
See application file for complete search history.

(56) References Cited

U.S. PATENT DOCUMENTS

| | | |
|---|---|---|
| 3,657,579 A | 4/1972 | Kramer |
| 5,747,914 A | 5/1998 | Huang et al. |
| 5,866,968 A | 2/1999 | Mech |
| 5,894,184 A | 4/1999 | Furuhashi et al. |
| 6,617,754 B1 | 9/2003 | Knauss |
| 2005/0104475 A1* | 5/2005 | Kataoka ............... H02N 2/0075 310/317 |
| 2005/0225203 A1 | 10/2005 | Chou |

(Continued)

FOREIGN PATENT DOCUMENTS

| | | |
|---|---|---|
| CN | 1249068 A | 3/2000 |
| CN | 1261986 A | 8/2000 |
| DE | 19825210 A1 | 10/1999 |

(Continued)

OTHER PUBLICATIONS

Machine translation of JP02-036777 from the website of the Japanese Patent Office.*

(Continued)

*Primary Examiner* — Derek Rosenau
(74) *Attorney, Agent, or Firm* — Slater Matsil, LLP

(57) ABSTRACT

A circuit assembly is used for controlling a piezoelectric transformer having an input capacitance in a first circuit branch. The circuit assembly also includes a second circuit branch for compensating for the input capacitance, preferably by means of a capacitive element, and a differential amplifier having two inputs. The first input is coupled to the first circuit branch and the second input is coupled to the second circuit branch.

16 Claims, 5 Drawing Sheets

(56) References Cited

U.S. PATENT DOCUMENTS

2013/0104647 A1    5/2013  Lopatin et al.
2014/0373607 A1   12/2014  Bauer et al.

FOREIGN PATENT DOCUMENTS

| DE | 102010030791 A1 | | 1/2012 | |
|---|---|---|---|---|
| DE | 102011090014 A1 | | 7/2013 | |
| EP | 0665600 A1 | | 8/1995 | |
| JP | 02-036777 | * | 2/1990 | ............... H02N 2/00 |
| JP | H08210856 A | | 8/1996 | |
| JP | 2010136115 A | | 6/2010 | |
| WO | 2013083678 A2 | | 6/2013 | |

OTHER PUBLICATIONS

"Multi-Topology Piezoelectric Transformer Controller—UCC 2975, UCC 2976, UCC2977, UCC3975, UCC3976, UCC3977," Texas Instruments, Jan. 2002, 30 pages.

NEC/TOKIN, "Devices thru Material Innovation—The right solution for every noise problem. The optimal solution for noise and power problems," http://www.nec-tokin.com/english/, retrieval date: Mar. 27, 2013, 1 page.

Nihon Ceratec, Main Products, http://www.ceratech.co.jp/index_e.html, retrieval date: Mar. 27, 2013, 2 pages.

Takahashi, S., et al., "Nonlinear Piezoelectric Response in Ferroelectric Ceramics Driven at Resonant Mode," ISAF '98, Proceedings of the Eleventh IEE International Symposium on Applications on Ferroelectrics, Aug. 24-27, 1998, pp. 381-384.

* cited by examiner

CIRCUIT ASSEMBLY AND METHOD FOR CONTROLLING A PIEZOELECTRIC TRANSFORMER

This patent application is a national phase filing under section 371 of PCT/EP2014/055515, filed Mar. 19, 2014, which claims the priority of German patent application 10 2013 103 159.5, filed Mar. 27, 2013, each of which is incorporated herein by reference in its entirety.

TECHNICAL FIELD

The present invention relates to a circuit assembly and a method for controlling a piezoelectric transformer.

BACKGROUND

A piezoelectric transformer, which may also be referred to as a piezo transformer, is an electromechanical system which acts as a resonance transformer. The piezoelectric transformer makes it possible to convert a supplied AC voltage into a higher or lower AC voltage. The conversion is able to occur at the resonance frequency of the piezoelectric transformer, which is determined by the mechanical dimensions and the material of the piezoelectric transformer.

One approach for controlling a piezoelectric transformer provides for using the input voltage, the input current, and their phase position as control information. Based on these parameters, control of the piezoelectric transformer and the control of its behavior are able to take place. However, this does not result in the optimal operating point of the piezoelectric transformer being reached. Losses occurring due to non-adjustable control influences affect the performance and efficiency of the piezoelectric transformer. This reactive power is provided by the supplier and converted by the piezoelectric transformer only on the primary side.

SUMMARY

The objective is the detection of a suitable controlled variable for controlling a piezoelectric transformer, in order to ensure optimized operation with minimal losses, under the selected operating conditions of the piezoelectric transformer, in the selected area or field of operation. The operation of the piezoelectric transformer is to be made possible within the desired framework during intermittent operation as well as continuous operation. A constant operating state of the piezoelectric transformer is to be ensured through the use of suitable feedback parameters.

For operating the piezoelectric transformer, it is necessary to supply it with its operating frequency and the required operating voltage and current in a corresponding phase position in all operating states (start, operation, change in load, changed environmental conditions), in order to ensure the function of the piezoelectric transformer.

The circuit assembly comprises a first circuit branch including a piezoelectric transformer which has an input capacitance, a second circuit branch which compensates for the input capacitance, and a differential amplifier having a first input which is coupled to the first circuit branch, and a second input which is coupled to the second circuit branch. The coupling may be established via a direct connection or via additional components.

This circuit assembly uses control variables which are available for describing the behavior of the piezoelectric transformer correctly in terms of phase and amplitude, and makes possible a low-loss excitation of the oscillations of the piezoelectric transformer.

The input capacitance of the piezoelectric transformer is a design-related capacitance between the piezoelectric transformer electrodes. The behavior of the piezoelectric transformer may be described by an equivalent circuit diagram. The equivalent circuit diagram of the piezoelectric transformer including a series resonant circuit comprising a capacitive element, an inductive element, and a resistor takes into account the input capacitance in the form of a capacitive element which is connected in parallel with the series resonant circuit. The current and voltage variables describing the behavior of the series resonant circuit are not directly accessible due to the parallel input capacitance.

In one embodiment, the first circuit branch includes a series connection of the piezoelectric transformer and a first resistor. The second circuit branch includes a series connection of a capacitive element and a second resistor. The second circuit branch is configured in a manner similar to the series connection of an input capacitance and a first resistor.

A series connection of a capacitor and a resistor is a high-pass filter. The symmetry of the high-pass filters in the first and second circuit branches allows for the compensation for the input capacitance in that the time constant of the series connection of a capacitive element and a second resistor in the second circuit branch is equal to or nearly equal to the time constant of the series connection of an input capacitance and a first resistor in the first circuit branch.

In one embodiment, the piezoelectric transformer is between a first and a second potential point in the first circuit branch, and the first resistor is between the second and a third potential point in the first circuit branch. The capacitive element is between a first and a second potential point in the second circuit branch, and the second resistor is between the second and a third potential point in the second circuit branch. In this embodiment, the second potential point in the first circuit branch is coupled to the first input, and the second potential point in the second circuit branch is coupled to the second input.

Because of the equal time constants, the signals occur in the high-pass filters having the same amplitudes and phase position, regardless of the frequency and amplitude of the control. Considered together, both signals occur as common-mode voltages at the input of the differential amplifier, so that they, and thus the signal component of the input capacitance of the piezoelectric transformer, are filtered out by the differential amplifier.

The signal obtained in such a manner is fed back into a loop and is the basis of the piezoelectric transformer control. For this purpose, an output of the differential amplifier is coupled to the piezoelectric transformer via a feedback branch. Advantageously, the fed-back signal is present at the first potential points of the first and second circuit branches and thus of the input electrode of the piezoelectric transformer. The third potential points are at a reference potential, which is also referred to as ground, so that a parallel connection of the high-pass filters exists.

In one embodiment, an additional amplifier is provided in the feedback branch, which is able to provide the control voltage for the piezoelectric transformer. An amplitude controller may be provided in the feedback branch which is placed in front of the additional amplifier.

In one embodiment, the output of the differential amplifier is coupled to the piezoelectric transformer via a pulse width modulator and two switch elements connected in series between two potential points. The switch elements are controlled by the pulse width signal in that one of the switches is conductively connected to the adjacent reference potential as a function of the pulse width signal. The control voltage for the piezoelectric transformer is tapped between the switch elements. This assembly amplifies the rectangular pulse width signal.

Advantageously, the circuit assembly includes a voltage control loop in which a signal which is present at the output of the differential amplifier is fed back, and a current control loop in which a current is fed back through the piezoelectric transformer, so that the detected current and voltage are taken into account during the control. The fed-back signals are compared to a desired signal. The control of the piezoelectric transformer is changed as a function of the comparison.

The corresponding method for controlling a piezoelectric transformer which has an input capacitance in a first circuit branch comprises detecting the voltage difference between the first circuit branch and a second circuit branch which compensates for the input capacitance, and feeding it back to the piezoelectric transformer in a feedback loop. Additional components may of course be provided in this loop.

In this method, the first circuit branch includes a series connection of the piezoelectric transformer and a first resistor, between which the potential is tapped, and the second circuit branch includes a series connection of a capacitive element and a second resistor, between which the potential is tapped. The time constant of the series connection of the capacitive element and the second resistor in the second circuit branch is equal to or nearly equal to the time constant of the series connection of an input capacitance and a first resistor in the first circuit branch.

BRIEF DESCRIPTION OF THE DRAWINGS

The present invention is explained below based on exemplary embodiments, with reference to the drawing.

DETAILED DESCRIPTION OF ILLUSTRATIVE EMBODIMENTS

Figure 1:
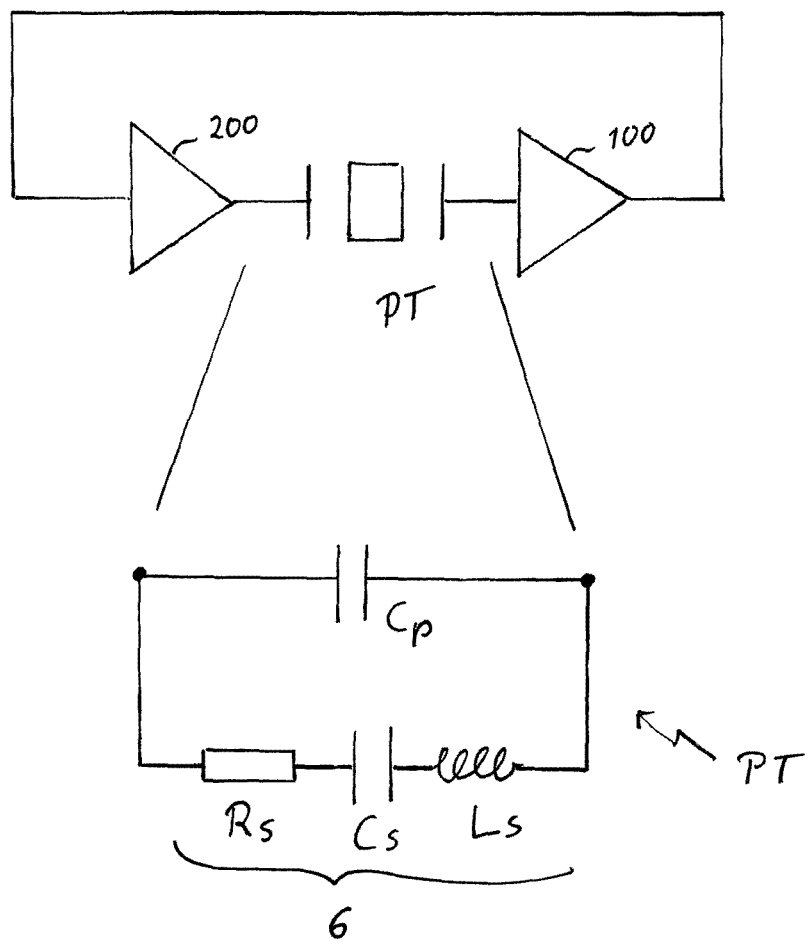
FIG. 1 schematically depicts a control circuit for a piezoelectric transformer.

FIG. 1 schematically depicts a control circuit for a piezoelectric transformer PT. The following embodiments first illustrate general thoughts for controlling the piezoelectric transformer PT in the control circuit, in which two amplifiers 100, 200 are connected in a loop and the piezoelectric transformer PT is inserted as a series element.

The behavior of a piezoelectric transformer PT controlled by such a circuit assembly may be described by a simplified equivalent circuit diagram (ECD) which takes into account the geometric dimensions of the piezoelectric transformer PT and the dielectric, elastic, and piezoelectric material constants. The components of the equivalent circuit diagram may, for example, be determined within the scope of an impedance measurement.

The equivalent circuit diagram comprises a lossy series resonant circuit 6 including a capacitive element Cs, an inductive element Ls, and a resistor Rs. A capacitive element Cp which is connected in parallel with the series resonant circuit 6 corresponds to the input capacitance of the piezoelectric transformer PT. The input capacitance Cp is a design-related parasitic capacitance which has a significant effect on the (external) total current.

The excitement of a piezoelectric transformer PT at its resonant frequency may be carried out by means of the self-oscillating closed-loop linear amplifier 100. For excitement at the series resonant frequency or parallel resonance frequency, the piezoelectric transformer PT is controlled by the linear amplifier 200 having a low output resistance. In case of resonance, a current overshoot occurs at the piezoelectric transformer PT. The current flowing through the piezoelectric transformer PT may be depicted as a voltage across a resistor (not shown in FIG. 1) acting as a current shunt and may thus be fed to the input of the exciter amplifier.

The phase condition for excitement at the resonant frequency is thus met, even with limitations due to the influence of the input capacitance Cp. The amplitude condition requires an amplification factor which is to be somewhat greater in practice than is required for compensating for the losses in the piezoelectric transformer PT. Such an exciter circuit including two amplifiers is referred to in the literature as a "butler" circuit.

Because of the input capacitance Cp, the current flowing through the series resonant circuit 6 which is required for the feedback is not accessible for a direct detection. In order nonetheless to generate a feedback signal which is suitable for the exciter circuit, a circuit for compensating for the effect of the input capacitance Cp is required.

Figure 2:
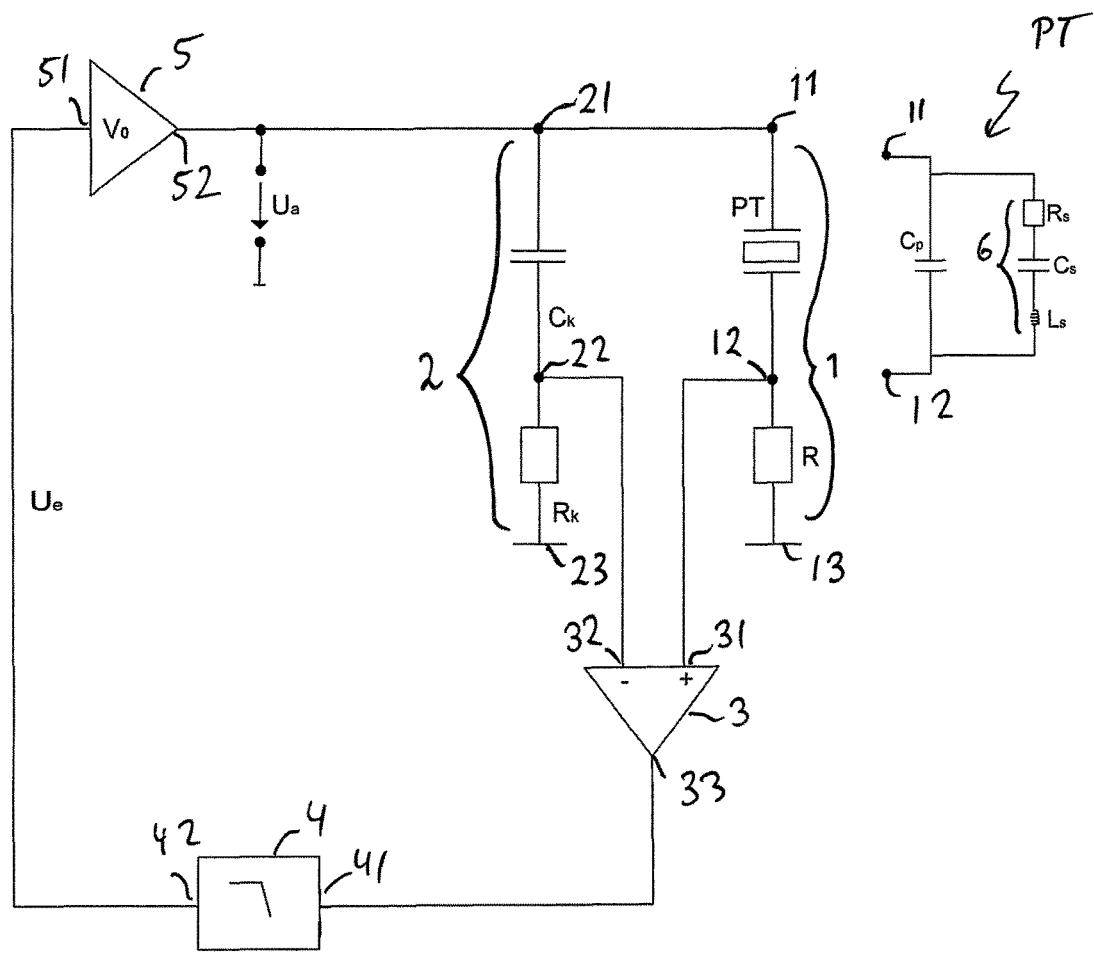
FIG. 2 depicts the circuit diagram of a circuit assembly for controlling a piezoelectric transformer.

FIG. 2 shows the circuit diagram of a circuit assembly for controlling a piezoelectric transformer PT which includes such a compensation.

The circuit assembly includes a first circuit branch 1 including a series connection of the piezoelectric transformer PT and a first resistor R, and a second circuit branch 2 including a series connection of a capacitive element Ck and a second resistor Rk. The second circuit branch 2 is used for compensating for the effect of the input capacitance Cp of the piezoelectric transformer PT.

The piezoelectric transformer PT is between a first and a second potential point 11, 12 in the first circuit branch 1, and the first resistor R is between the second and a third potential point 12, 13 in the first circuit branch 1. The third potential point 13 is at a reference potential, which may also be referred to as ground. The capacitive element Ck is between a first and a second potential point 21, 22 in the second circuit branch 2, and the second resistor Rk is between the second and a third potential point 22, 23 in the second circuit branch 2. The third potential point 23 is at the reference potential. The first and second circuit branches 1, 2 are connected in parallel.

The circuit assembly furthermore includes a differential amplifier 3 having a first input 31, an inverting second input 32, and an output 33. The first input 31 is connected to the second potential point 12 in the first branch 1. The second input 32 is connected to the second potential point 22 in the second branch 2. Alternatively, the potential points 12, 22 may also be coupled to the inputs 31, 32 via additional components. The differential amplifier 3 amplifies the difference between the applied input signals and provides a corresponding signal at the output. In an ideal differential amplifier having optimal common-mode rejection, the output voltage is a function only of the voltage difference, not the absolute level of the two applied voltages.

The circuit assembly furthermore includes an amplitude controller 4 which changes the amplitude of the signal on the input side. If the amplitude is reduced, it is also referred to an amplitude limiter. Exemplary embodiments of the amplitude controller 4 may provide a linear or nonlinear signal influence. The input 41 of the amplitude controller 4 is connected to the output 33 of the differential amplifier 3.

The circuit assembly furthermore includes an additional amplifier 5 which amplifies an input signal Ue by a factor V0. One input 51 of the amplifier 5 is connected to the output 42 of the amplitude controller 4. The output 52 of the amplifier 5 is connected to the first potential points 11, 21 of the first and second circuit branches 1, 2, so that an output voltage Ua of the amplifier 5 is present across both the first and the second circuit branch 1, 2. Alternatively, the output 52 of the amplifier 5 may be coupled to the first potential points 11, 21 via additional components.

The input capacitance Cp and the first resistor R acting as a shunt or shunt resistor form a high-pass filter, like the capacitive element Ck and the second resistor Rk of the second circuit branch 2 acting as a compensation branch. The sizing of the components Ck, Rk, R is selected in such a way that both high-pass filter branches have the same time constant τ=RC (i.e., τ=R*Cp or τ=Rk*Ck) and thus have the same cutoff frequency. The signals from both the second circuit branch 2 and the high-pass filter of the first circuit branch 1 appear at the inputs 31, 32 of the differential amplifier 3 having the same amplitude and phase position, regardless of the frequency and amplitude of the control. The precondition for this is an input capacitance Cp which is independent of the amplitude of the applied voltage.

Considered together, these two signals appear as a common-mode voltage on the input side of the differential amplifier 3 and are suppressed by it, so that only the signal magnitude of the series resonant circuit 6 is amplified. Under ideal conditions, the differential amplifier 3 supplies a phase-correct feedback signal which at least largely corresponds to the equivalent circuit diagram of the piezoelectric transformer PT.

Figure 3:
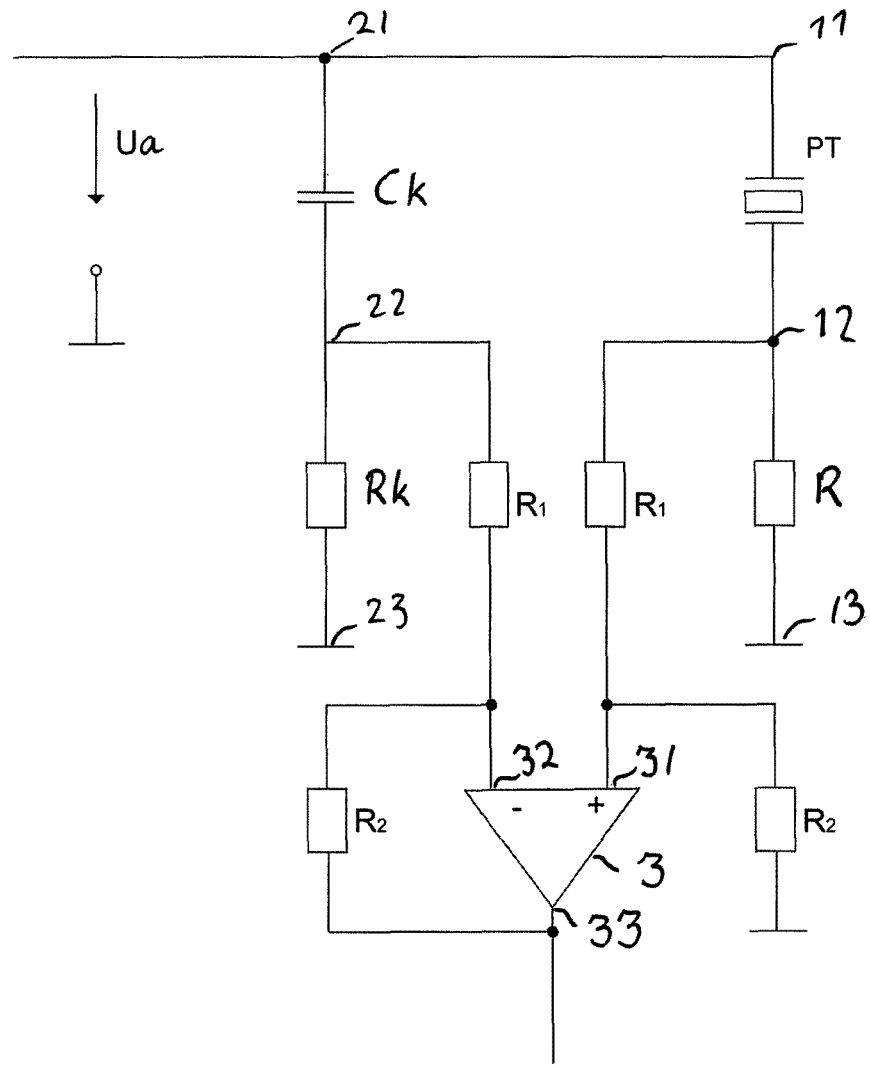
FIG. 3 depicts a circuit configuration of a differential amplifier.

FIG. 3 depicts a circuit configuration of the differential amplifier 3 (test circuit), which differs from the circuit configuration depicted in FIG. 2 as follows.

Resistors R1 are connected between the first and second inputs 31, 32 of the differential amplifier 3 and the second potential nodes 12, 22. Furthermore, an additional resistor R2 is connected between the first input 31 and the reference potential. An additional resistor R2 is also connected between the second input 32 and the output 33. By choosing the resistance values of R1 and R2, it is possible to set the amplification factor, which is a function of their quotients. It should be noted that the displayed circuit diagram may be part of an amplifier loop as depicted in FIG. 2.

In such a loop, after applying the supply voltage Ua, the oscillation starts as a result of the electric noise in the closed feedback loop. In addition to the phase and amplitude conditions, the prerequisite is an amplifier which is linear at least for small signals and which has sufficient bandwidth. The amplifier is to have no additional phase shifts unless they are desirable for the purpose of control. At higher amplitudes, a nonlinearity in terms of an amplitude limitation may exist and be desirable. An amplitude limitation is also possible at the input of the amplifier. FIG. 2 depicts an amplitude limitation 4 on the output side of the differential amplifier 3.

The addition of an amplitude controller 4 to the feedback branch allows the exciter signal to remain sinusoidal, so that harmonics are avoided. Such an amplitude control may occur via a measurement of the current amplitude, a comparison with a setpoint value, and a resulting change in the amplification factor of the feedback loop. This assembly will oscillate within the bandwidth of the amplifier at the frequency at which the piezoelectric transformer PT has the highest quality, i.e., the highest loop gain. If this is not the desired operating frequency, a bandpass filter (not shown) may be inserted into the feedback loop. Possible spurious resonances are thus selectively suppressed.

The described design may be used in different variants or types of a control circuit.

Figure 4:
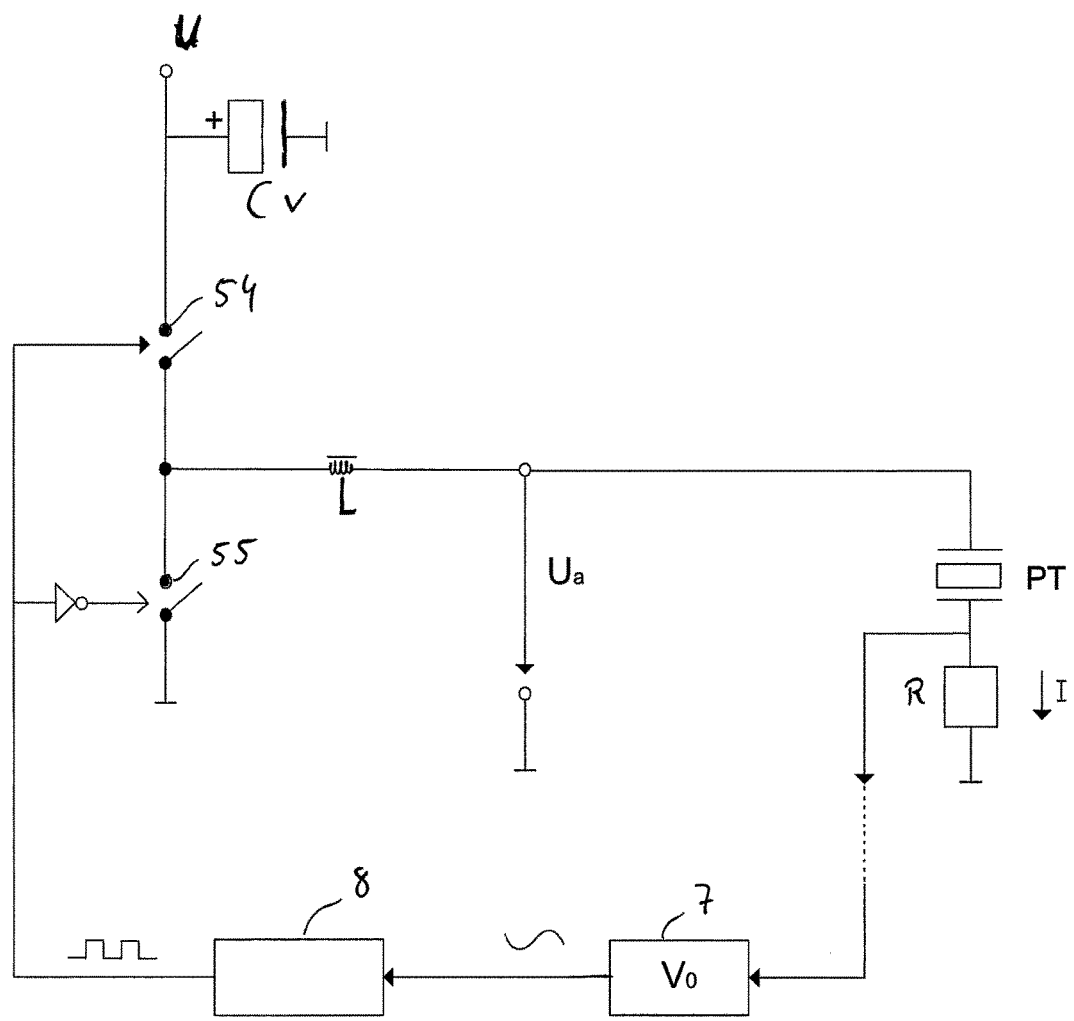
FIG. 4 depicts the circuit diagram of an additional circuit assembly for controlling a piezoelectric transformer.

FIG. 4 depicts the schematic circuit diagram of an alternative circuit assembly for controlling the piezoelectric transformer.

The circuit assembly includes a piezoelectric transformer PT within a measuring circuit, whose current I flows across a resistor R. The voltage, which is proportional to the current I flowing across the resistor R, is applied to an amplifier 7 whose output is coupled to a pulse width modulator 8. Its output signal is a pulse width signal, i.e., a rectangular signal in which the duty factor of the rectangular pulses, i.e., the width of the rectangular pulses, is modulated. A half-bridge circuit is controlled by the pulse width signal. In this circuit, a supply voltage U is present across two switch elements 54, 55, for example, power MOSFETs, which are connected in series. The first switch element 54 is connected to the supply potential. The second switch element 55 is connected to the reference potential. The input electrode of the piezoelectric transformer PT is present at a potential point between the switch elements 54, 55 across an inductive element L which smooths the output current.

The pulse width signal controls one of the switch elements 54, and the inverse pulse width signal controls the other switch element 55, so that one of the switch elements 54, 55 is always in a conductive state while the other is in a nonconductive state. If the first switch element 54 is in a conductive state, the supply voltage U is present at the potential point between the switch elements 54, 55. If the second switch element 55 is in a conductive state, the reference potential is present at the potential point between the switch elements 54, 55.

This control may be motivated as follows. When the piezoelectric transformer PT is excited at its series resonance frequency or parallel resonance frequency fs, the increased current also flows through the power amplifier. In addition, there is the current flowing through the parasitic input capacitance Cp. In an amplifier having output stage transistors in Class AB/B operation, substantial power losses may occur, depending on the size of the piezoelectric transformer PT.

One possible remedy is to operate the output stage in Class D (switch mode). The transistors function as switches 54, 55, and an inductive element L smooths the output current.

Figure 5:
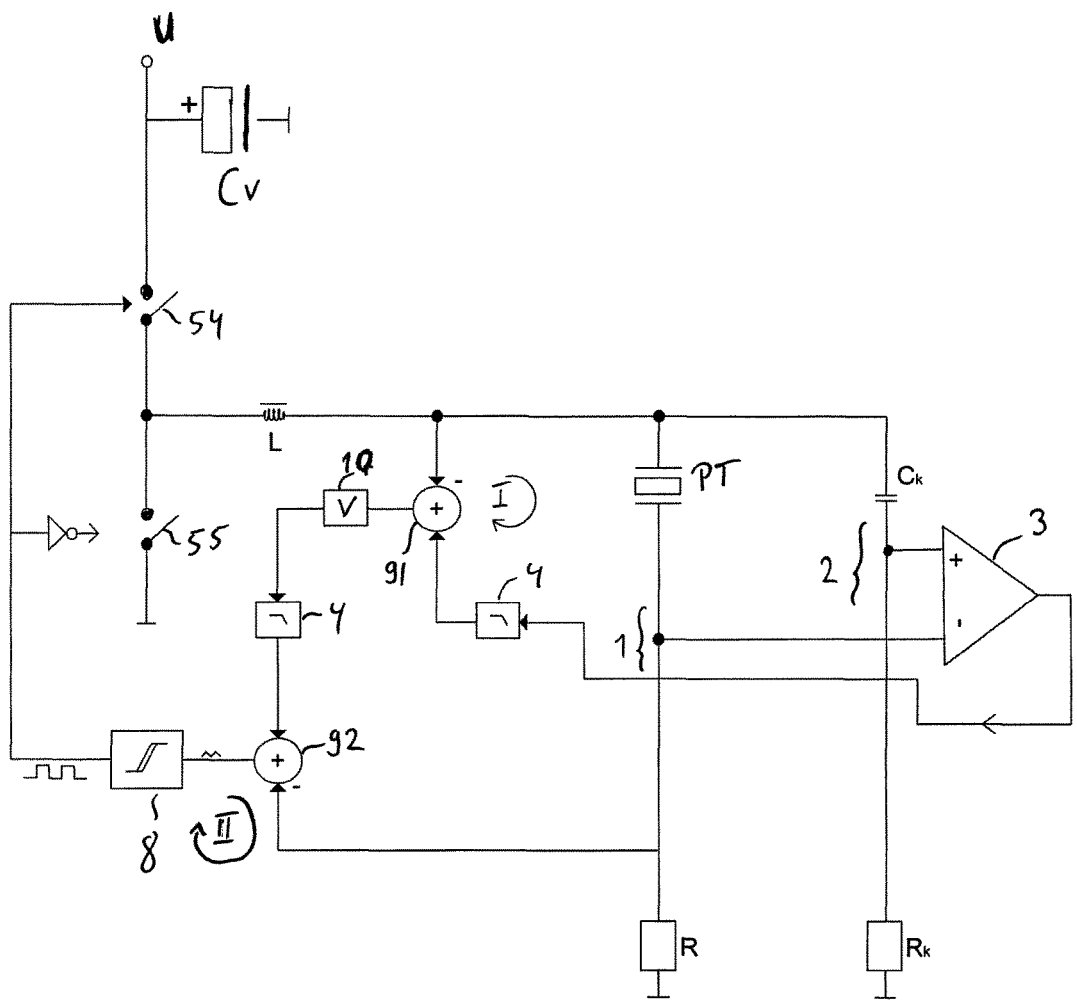
FIG. 5 depicts the circuit diagram of another circuit assembly for controlling a piezoelectric transformer.

FIG. 5 depicts the schematic circuit diagram of a circuit assembly having input capacitance compensation based on the design depicted in FIG. 4. This is an oscillator circuit for a piezoelectric transformer having a Class D output stage (switch mode).

In order to give the circuit design the external behavior of a linear amplifier, which is required for initiating oscillation, a pulse width modulator 8 including a controller is required.

The operation of the clocked output stage having a constant current ripple (delta I) and an internal current control loop is recommended here. The limitation of the maximum control current may occur within this control loop. An unconditional short-circuit withstand capability at the output is thus ensured.

An external voltage control loop adjusts the setpoint value of the current in such a way that the desired voltage Ua results at output of the amplifier.

FIG. 5 depicts such a circuit assembly. It is recommended that the operating frequency of the Class D output stage is considerably above the resonance frequency of the piezoelectric transformer PT; a factor of 10 or greater is desirable.

The capacitor Cv between the supply and reference potentials acts in connection with the inductive element L as an accumulator for the current flowing through the piezoelectric transformer (Q=CU=it).

The circuit assembly includes a first circuit branch 1 having a series connection of a piezoelectric transformer PT and a first resistor R, which acts as a shunt. The first circuit branch 1 is connected in parallel with a second circuit branch 2 having a series connection of a capacitive element Ck and a second resistor Rk. The signal is tapped between the components PT and R, or Ck and Rk, of the circuit branches 1, 2, and is fed to a differential amplifier 3. On the output side, an amplitude controller 4 or amplitude limiter is provided whose output signal is present at a first subtracting element 91. The setpoint voltage, which is tapped after the inductive element, is also present at the first subtracting element 91. The subtracting element 91 provides the difference between two input signals. On the output side, the subtractor is connected to a controller 10 which changes, in particular amplifies, the difference between the signals which are present at the subtractor 91. The resulting voltage is routed via a limiter 4 as a setpoint value to a second subtracting element 92, at which the voltage across the first resistor R is also present, which is proportional to the current flowing through the piezoelectric transformer PT. The resulting deviation of the setpoint and actual values on the output side of the subtracting element 92 is coupled to a signal generator 8, which generates the pulse mode signal for controlling the half-bridge circuit using two switch elements 54, 55 connected in series, as already described in FIG. 4.

This circuit assembly has both a feedback loop I for voltage control, in which the exciter voltage and amplitude-controlled output voltage at the differential amplifier are compared by the first subtracting element 91, and the result is fed to the subtracting element 92. A second feedback loop II for performing current control compares the resulting value, which is proportional to the setpoint current, with the voltage across the shunt R, which is proportional to the actual current, and controls the piezoelectric transformer PT as a function of the result.

The described compensation design may also be combined with a control circuit of another type. The only requirement is to detect the variables of the piezoelectric transformer PT by means of a compensation branch 2 and a differential amplifier 3 and to feed them into the control.

Instead of a linear amplifier, other amplifier types may be used, for example, a design including a switching variable-gain amplifier.

It should be noted that the features of the exemplary embodiments may be combined. In addition, this design may also be applied to other piezoelectric products.

The invention claimed is:
1. A circuit assembly comprising:
a first circuit branch including a piezoelectric transformer that has an input capacitance;
a second circuit branch that compensates for the input capacitance; and
a differential amplifier having a first input coupled to the first circuit branch and a second input coupled to the second circuit branch,
wherein the second circuit branch includes a series connection of a capacitive element and a second resistor, and
wherein a time constant of the series connection of the capacitive element and the second resistor in the second circuit branch is substantially equal to a time constant of the series connection of the input capacitance and a first resistor in the first circuit branch.

2. The circuit assembly according to claim 1, wherein the first resistor is coupled in series with the piezoelectric transformer.

3. The circuit assembly according to claim 1, wherein
the piezoelectric transformer is between a first and a second potential point in the first circuit branch,
wherein the first resistor is between the second and a third potential point in the first circuit branch,
wherein the capacitive element is between a first and a second potential point in the second circuit branch,
wherein the second resistor is between the second and a third potential point in the second circuit branch, and
wherein the second potential point in the first circuit branch is coupled to the first input, and the second potential point in the second circuit branch is coupled to the second input.

4. The circuit assembly according to claim 3, wherein an output of the differential amplifier is coupled to the piezoelectric transformer via a feedback branch, and wherein a fed-back signal is present at the first potential point of the first circuit branch and the first potential point of the second circuit branch.

5. The circuit assembly according to claim 1, wherein, in an equivalent circuit diagram of the piezoelectric transformer including a series resonant circuit comprising a capacitive element, an inductive element, and a resistor, the input capacitance corresponds to a capacitive element that is connected in parallel with the series resonant circuit.

6. The circuit assembly according to claim 1, wherein an output of the differential amplifier is coupled to the piezoelectric transformer via a feedback branch.

7. The circuit assembly according to claim 6, further comprising an additional amplifier in the feedback branch.

8. The circuit assembly according to claim 6, further comprising an amplitude controller in the feedback branch.

9. The circuit assembly according to claim 6, wherein the output of the differential amplifier is coupled to the piezoelectric transformer via a pulse width modulator and two switch elements connected in series between two potential points.

10. The circuit assembly according to claim 6, wherein the circuit assembly includes a voltage control loop in which a signal that is present at the output of the differential amplifier is fed back, and a current control loop in which a signal that is proportional to current flowing through the piezoelectric transformer is fed back.

11. A method for controlling a piezoelectric transformer that has an input capacitance in a first circuit branch, the method comprising:
detecting a voltage difference between the first circuit branch and a second circuit branch that compensates for the input capacitance; and
feeding the voltage difference back to the piezoelectric transformer in a feedback loop, wherein the first circuit branch includes a series connection of the piezoelectric transformer and a first resistor, between which a first potential is tapped, wherein the second circuit branch includes a series connection of a capacitive element and a second resistor, between which a second potential is tapped, wherein the voltage difference is a difference between the first potential and the second potential, and wherein a time constant of the series connection of the capacitive element and the second resistor in the second circuit branch is substantially equal to a time constant of the series connection of an input capacitance and a first resistor in the first circuit branch.

12. A circuit assembly comprising:
a first circuit branch including a series connection of a piezoelectric transformer, which has an input capacitance, and a first resistor, the piezoelectric transformer being located between a first and a second potential point in the first circuit branch and the first resistor being located between the second and a third potential point in the first circuit branch;
a second circuit branch which compensates for the input capacitance, the second circuit branch including a series connection of a capacitive element and a second resistor, the capacitive element being located between a first and a second potential point in the second circuit branch and the second resistor being located between the second and a third potential point in the second circuit branch, wherein a time constant of the series connection of the capacitive element and the second resistor in the second circuit branch is substantially equal to a time constant of the series connection of the input capacitance and the first resistor in the first circuit branch; and
a differential amplifier having a first input coupled to the second potential point in the first circuit branch and a second input coupled to the second potential point in the second circuit branch,
wherein an output of the differential amplifier is coupled to the piezoelectric transformer via a feedback branch, and
wherein the output of the differential amplifier is coupled to the piezoelectric transformer via a pulse width modulator and two switch elements connected in series between two potential points.

13. The circuit assembly according to claim 12, wherein a fed-back signal is present at the first potential point of the first and the first potential point of the second circuit branch.

14. The circuit assembly according to claim 12, further comprising an additional amplifier in the feedback branch.

15. The circuit assembly according to claim 12, further comprising an amplitude controller in the feedback branch.

16. A circuit assembly comprising:
a first circuit branch including a piezoelectric transformer that has an input capacitance;
a second circuit branch that compensates for the input capacitance; and
a differential amplifier having a first input coupled to the first circuit branch and a second input coupled to the second circuit branch,
wherein an output of the differential amplifier is coupled to the piezoelectric transformer via a feedback branch, and
wherein the output of the differential amplifier is coupled to the piezoelectric transformer via a pulse width modulator and two switch elements connected in series between two potential points.

* * * * *